US006703860B1

(12) United States Patent
Agrawal et al.

(10) Patent No.: US 6,703,860 B1
(45) Date of Patent: Mar. 9, 2004

(54) I/O BLOCK FOR A PROGRAMMABLE INTERCONNECT CIRCUIT

(75) Inventors: Om P. Agrawal, Los Altos, CA (US); Jinghui Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/021,844

(22) Filed: Dec. 14, 2001

(51) Int. Cl.[7] .............................................. H03K 19/177
(52) U.S. Cl. ............................ 326/41; 326/38; 326/39; 326/40
(58) Field of Search ...................... 326/38–41

(56) References Cited

U.S. PATENT DOCUMENTS 5,621,650 A * 4/1997 Agrawal et al. ............. 716/16
5,966,027 A * 10/1999 Kapusta et al. ............. 326/39
6,034,541 A    3/2000 Kopec, Jr. et al.
6,211,696 B1 * 4/2001 Skahill et al. ............... 326/41
6,441,642 B1 * 8/2002 Jones et al. ................. 326/41

* cited by examiner

Primary Examiner—Vibol Tan
(74) Attorney, Agent, or Firm—McPherson Kwok Chen & Heid LLP

(57) ABSTRACT

A programmable interconnect circuit comprising a plurality of I/O cells arranged into I/O blocks includes a routing structure for each I/O block, wherein each routing structure may programmably route signals between the plurality of I/O cells and the I/O cells within its I/O block. Each I/O cell includes a multiplexer and an I/O circuit associated with a pin of the programmable interconnect circuit. Associated with each I/O block is a control array receiving control signals from its routing structure. An AND array in the control array produces a set of product term control signals for its I/O block from the received control signals.

39 Claims, 8 Drawing Sheets

I/O BLOCK FOR A PROGRAMMABLE INTERCONNECT CIRCUIT

RELATED APPLICATION

This application is related to U.S. application "Block-Oriented Architecture for a Programmable Interconnect Circuit," Ser. No. 10/022,464, concurrently filed herewith, and U.S. application "Multi-level Routing Structure for a Programmable Interconnect Circuit," Ser. No. 10/023,053, concurrently filed herewith, the contents of both of which are hereby incorporated by reference in their entirety.

BACKGROUND

1. Field of the Invention

This invention relates generally to programmable interconnect circuits, and more particularly to the input and output of data through such a circuit. This invention relates to programmable interconnect circuits, and more particularly to a programmable interconnect circuit having a control array for generating control functions.

2. Description of Related Art

In-system-programmable interconnect devices permit a user to programmably route signals between pins of the device. For example, Lattice Semiconductor Corp. currently manufactures an ispGDX® family of programmable interconnect devices having a non-volatile $E^2CMOS$® in-system-programmable crossbar switch matrix for programmable switching, interconnect, and jumper functions. Each pin of the ispGDX® device is associated with an input/output (I/O) circuit that programmably couples to other I/O circuits through a routing structure denoted as a global routing pool (GRP). The I/O circuits contain registers allowing the input and output signals on the associated pins to be selectively registered.

Referring now to FIG. 1, an input/output circuit 10 for an ispGDX® device couples to a 4:1 multiplexer (Mux) 12 that receives signals A, B, C, and D from four different routing structures, GRP_A, GRP_B, GRP_C, and GRP_D, (not illustrated) respectively. Each routing structure corresponds to a given quadrant (a side of the integrated circuit) for the device. Accordingly, GRP_A receives the input signals from I/O pins 20 in quadrant A, GRP_B receives the input signals from I/O pins 20 in quadrant B, and so on. Input/output circuit 10 receives its input signals from its pin 20 and directs them to the appropriate global routing structure on path 19. For example, if I/O circuit is within quadrant A, path 19 would couple to GRP_A.

Each routing structure is a switch matrix that may receive input signals from selected I/O circuits and programmably route output signals to selected 10 circuits. For clarity, the individual structures are grouped together and jointly designated by a single routing structure 14. A similar device or circuit is disclosed in U.S. Pat. No. 6,034,541, the contents of which are hereby incorporated by reference in their entirety. In addition, each global routing pool has a switch matrix fused by an in-system-programmable non-volatile E2CMOS® memory bank, configured for one-way routability. A given memory cell in the volatile E2CMOS® memory bank controls the state of a "fuse point" in the switch matrix. The fuse point may be formed by, e.g., a pass transistor that will programmably connect an input lead of the switch matrix to an output lead of the switch matrix, depending upon the logical state (high or low) of the fuse point's memory cell. I/O pins 20 to the device are arranged in quadrants (the four sides to the chip) such that an individual routing structure receives signals from the I/O circuits 10 in a single quadrant and may distribute these signals to the I/O circuits 10 in all four quadrants. Thus, the four input signals A, B, C, and D for each Mux 12 are "quadrant" limited to originate in their respective quadrants. Note that, with respect to routing structure 14, each I/O circuit 10 is independent and separate from the remaining I/O circuits. Because routing structure 14 distributes signals independently to each I/O circuit 10, the resulting arrangement may be denoted as "pin-oriented" or "bit-oriented" in that each I/O circuit 10 associates with a single I/O pin 20.

Similar to the data signals, control signals, such as the set/reset, clock, and clock enable (CE) for an input/output register (not illustrated) located within I/O circuit 10, the output enable (OE) for an output buffer (not illustrated) located within I/O circuit 10, as well as the MUX selects for MUX 12, are also limited to originating in a subset of pins 20 from each quadrant. Moreover, the prior art device had no control logic capability for these control signals such that the control function for each signal was limited to a single pin.

Although this "bit-oriented" architecture allowed a user to programmably interconnect signals through the device, the number of fuses in the resulting global routing pool becomes prohibitive as the pin count increases. However, modern board density continues to increase, demanding an interconnect device having a suitable number of pins to interconnect the signals.

Accordingly, there is a need in the art for an improved programmable interconnect device that uses fewer fuses and provides a control function capability for the I/O cells' control signals.

SUMMARY

In accordance with one aspect of the invention, a programmable interconnect circuit includes a plurality of I/O cells arranged into I/O blocks. Each I/O block has its own routing structure programmably coupling signals between the I/O block and the I/O cells in the remaining I/O blocks. In this fashion, an I/O cell in a given I/O block may programmably receive control signals from the I/O cells in the remaining I/O blocks. For each I/O block, an AND array programmably generates product-term control signals from control signals received from its I/O block's routing structure. The product-term control signals control registers and multiplexers within each I/O block's I/O cells.

The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
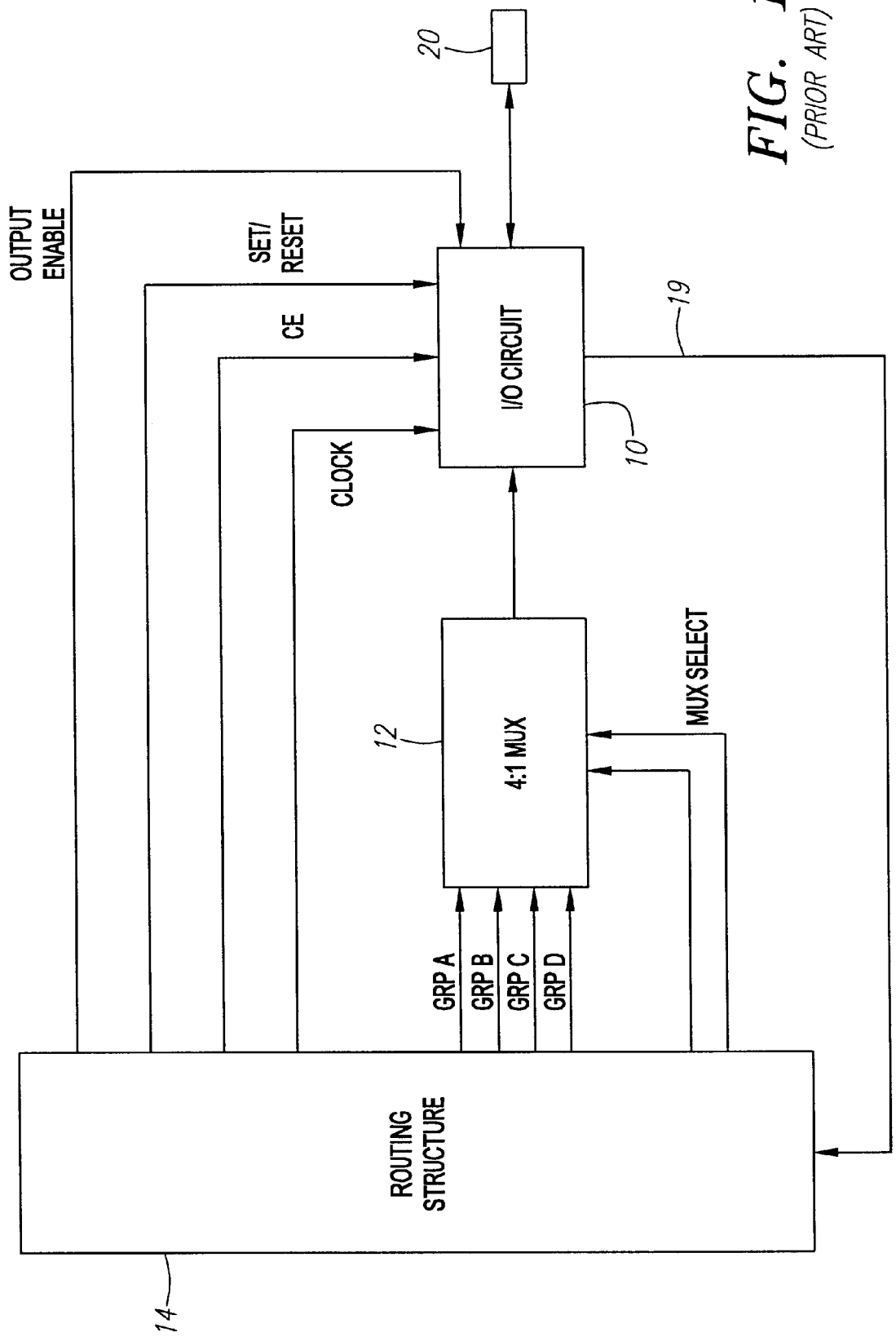
FIG. 1 illustrates a prior art programmable interconnect architecture.
Figure 2:
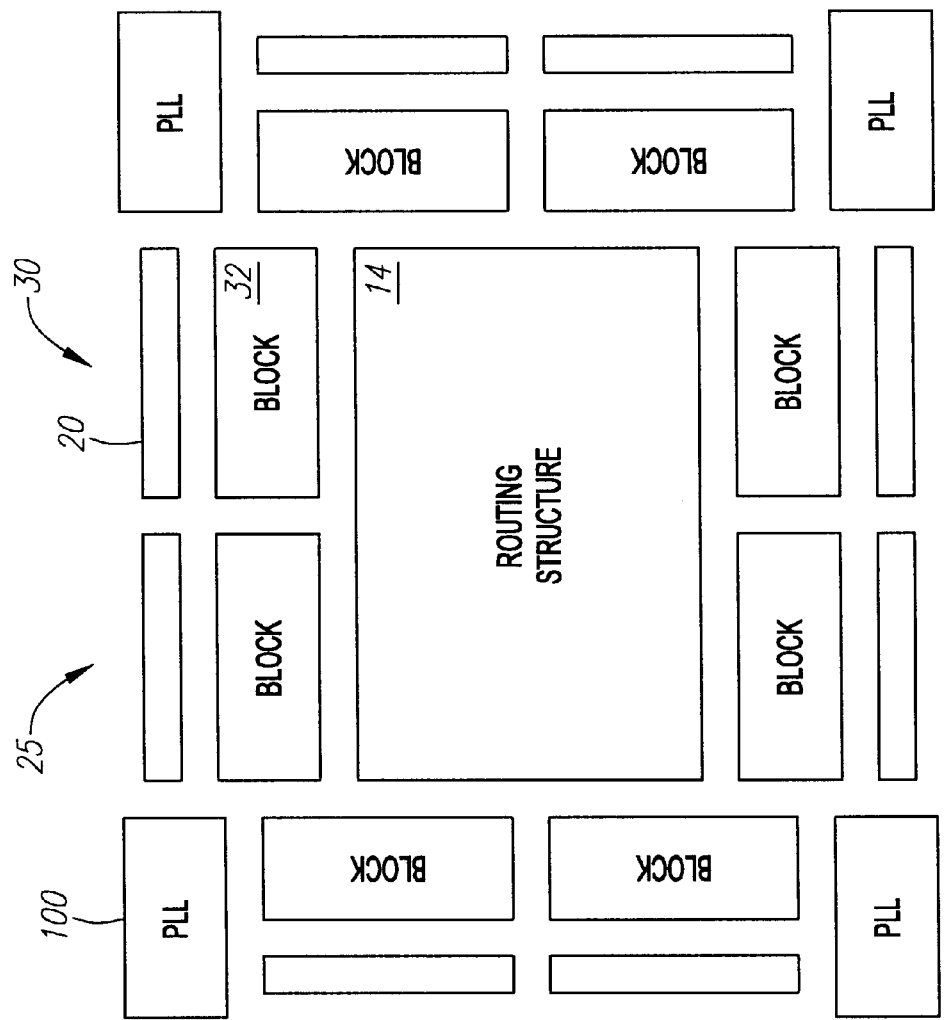
FIG. 2 illustrates a block-oriented architecture for a programmable interconnect circuit according to one embodiment of the invention.
Figure 3:
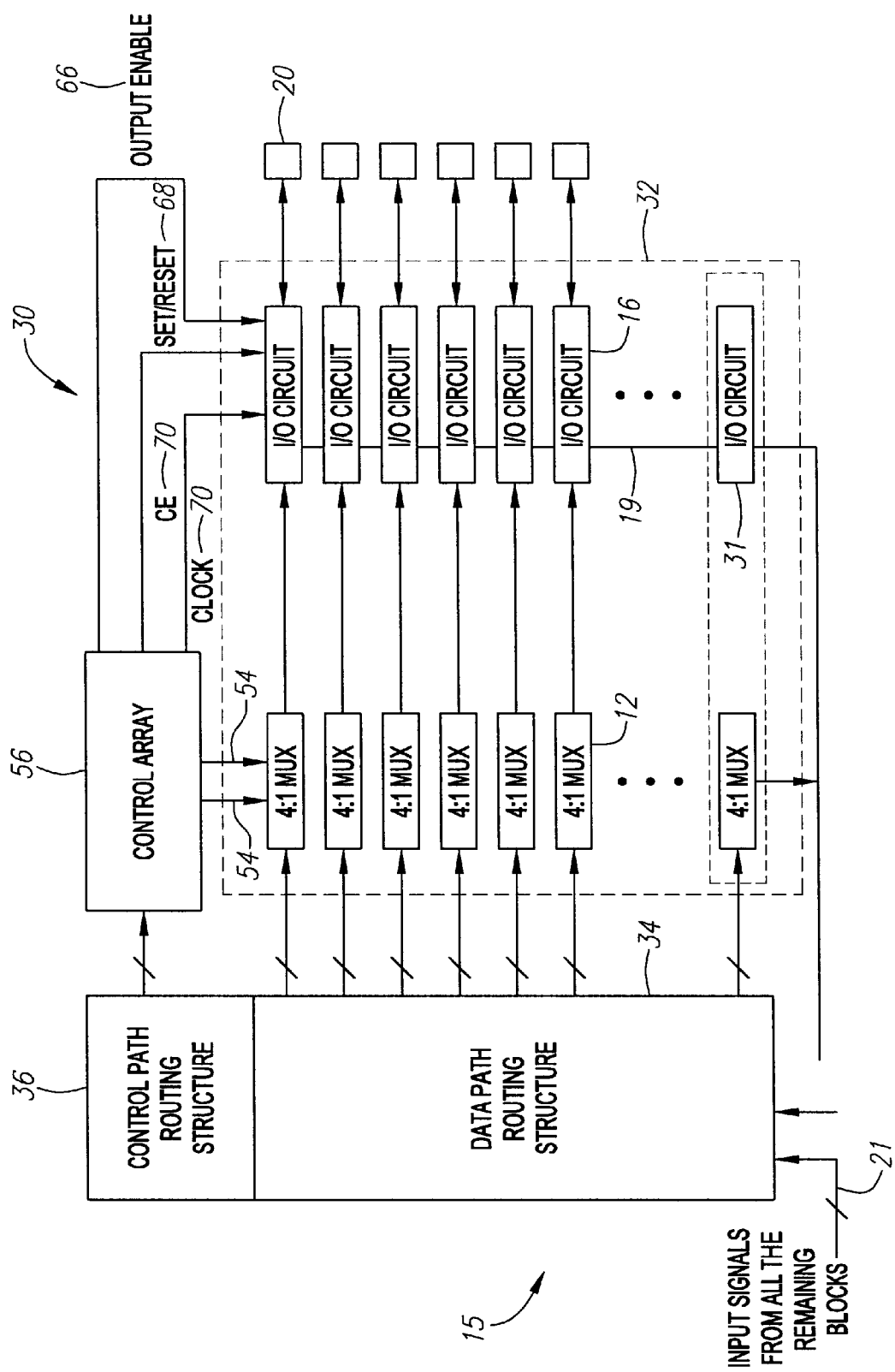
FIG. 3 illustrates further aspects of block-oriented architecture for the programmable interconnect circuit of FIG. 2 according to one embodiment of the invention.

Referring now to FIGS. 2 and 3, a "block-oriented" programmable interconnect architecture 30 is illustrated. In contrast to the "bit-oriented" architecture of the prior art, the I/O circuits 16 (FIG. 3) are arranged in I/O blocks 32 such that each block 32 having a plurality X of I/O circuits 16 associates with its own routing structure 15 (FIG. 3). In general, X is arbitrary as any number of I/O circuits 16 may be assigned to an I/O block 32. However, because bus-switching applications typically route binary signals in groups of 8 (one byte) or 16 (two bytes), assigning 16 I/O circuits per I/O block 32 as illustrated in FIG. 3 is particularly convenient. It will be appreciated, however, that other numbers of I/O circuits 16 per I/O block 32 may be used, for example, 4, 8, 32, or 64—whatever matches a desired bus width. Each I/O circuit 16 may be contained within an I/O cell 31, which also includes a 4:1 Mux 12 for selecting data signal inputs for its I/O circuit 16 (for clarity, only one I/O cell 31 is illustrated in FIG. 3). In FIG. 2, the routing structures 15 are collectively denoted as a single routing structure 14. Referring again to FIG. 3, each I/O circuit 16 may receive input signals from its pin 20. These input signals may comprise data signals that will ultimately be routed to other pins 20. Alternatively, these input signals may comprise control signals for controlling, for example, multiplexers 12 or registers within I/O circuits 16.

As will be described further herein, interconnect device 25 is programmable because of its association with a programmable memory (not illustrated), which is typically non-volatile but may be implemented as a volatile memory if desired. A user would program memory elements within the programmable memory to desired logic levels. These memory elements then control programmable elements such as fuse points, multiplexers, and switches within interconnect device 25 so as to effect a desired mode of operation. The programmable memory is preferably in system programmable, such that a user may change the programming during operation of the interconnect device.

Each I/O block 32 may receives signals from two independent routing structures contained within routing structure 15: a data-path routing structure 34 for programmably routing data signals, and a second control-path routing structure 36 for programmably coupling control signals to a control array 56, which in turn provides product-term control signals to I/O block 32. It will be appreciated that although data-path routing structure 34 and the control-path routing structure 36 are independent, such independence may be conceptual only in that the data-path routing structure 34 and control-path routing structure 36 may be combined into a single global routing structure. For example, a single switch matrix may accommodate both data and control signals. However, the fuse patterns within the switch matrix or global routing structure may differ according to whether data signals or control signals are being routed.

Control array 56 within I/O block 32 produces a set of product-term control signals. One subset of product-terms signals provides the MUX select signals 54 for the 4:1 MUXes 12. Each I/O circuit 16 within an I/O cell 31 may include an input register 90, an output register 92, and an output enable register 94 discussed with respect to FIG. 7. Other subsets of product-term signals from the control array 56 provide the clock and clock enable (CE) signals 70, the set/reset signals 68 and the OE signals 66 for these registers. Further details of the block-oriented architecture disclosed in FIGS. 2 and 3 are provided in U.S. application "Block-Oriented Architecture for a Programmable Interconnect Circuit," concurrently filed herewith.

Arranging the I/O cells into I/O blocks 32 allows each data-path routing structure 34 and control-path routing structure 36 to be arranged in a two-level organization for minimizing the required number of fuses while providing flexible signals. Additional details and structure for the two-level data-path routing structure and two level control-path routing structure are described in co-pending U.S. application "Multi-level Routing Structure for a Programmable Interconnect Circuit," concurrently filed herewith.

Figure 4:
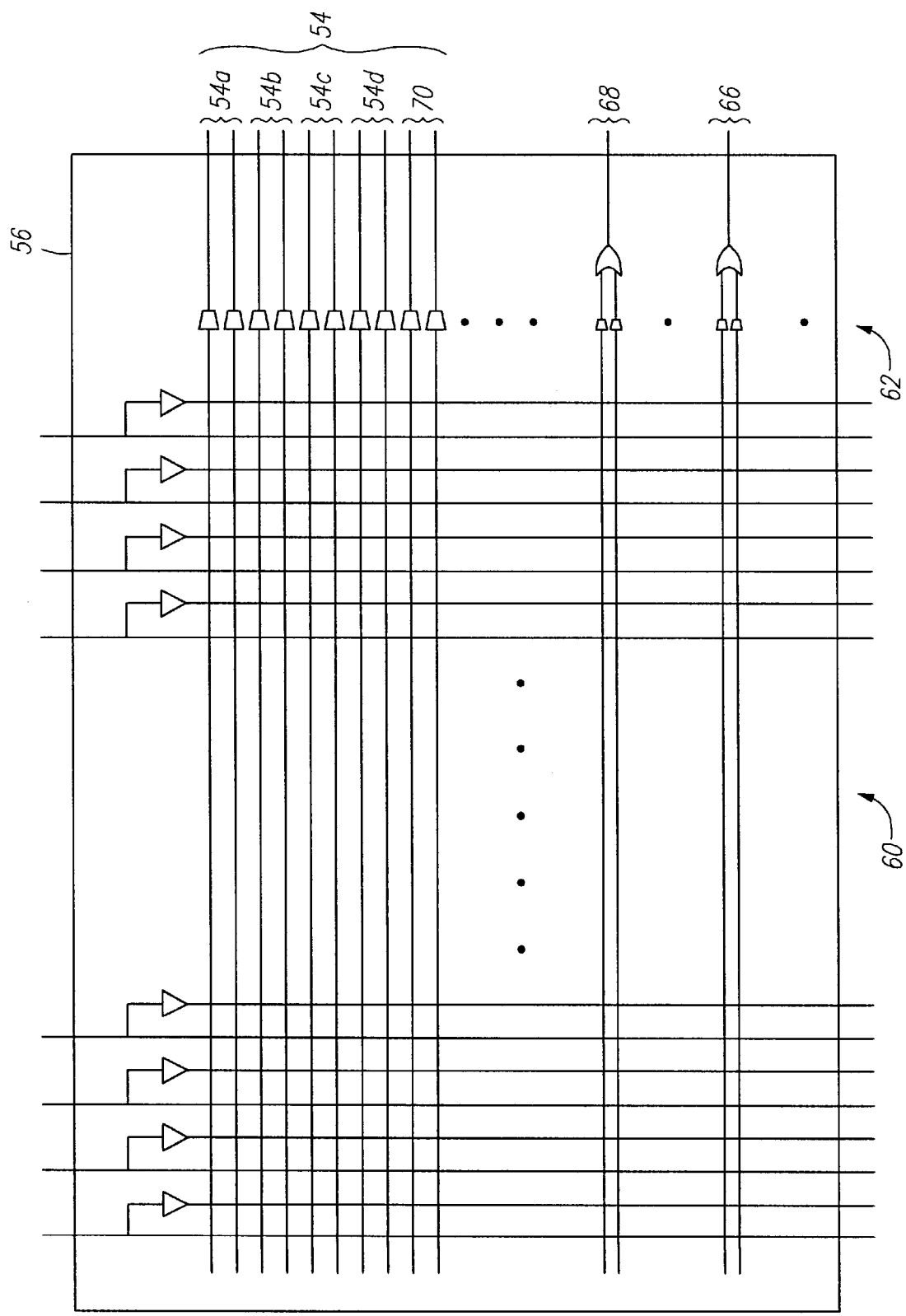
FIG. 4 illustrates a control array for generating product-term control signals according to one embodiment of the invention.

To generate independent control functions for the control signals developed by the control-path routing structure 36, the control array 56 within I/O block 32 (FIG. 3) has an AND array 60 to form product-terms 62 as illustrated in FIG. 4. Product-terms 62 may provide all the necessary control signals for the respective I/O block 32. Control array 56 receives both the true and complement of the outputs from control-path routing structure 36. For an embodiment having 32 output signals from the control-path routing structure 36, the AND array 60 thus receives 64 signals. The number of product terms 62 derived from the AND array 60 depends upon the balance desired between fuse count and control function capability. Although a full CPLD-like AND-OR plane could be used, a satisfactory level of control function capability may provided by just an AND array or an AND array coupled with a limited OR plane capability, thereby minimizing the required number of fuses. As shown in FIG. 3, desired control signals include the MUX selects 54 for the 4:1 MUXes 12, output enable signals (OE) 66, set/resets 68, clock and clock enable (CE) signals 70. In the embodiment illustrated, the AND array 60 produces 20 control signals: 8 product-term MUX selects 54, four product-term clock/clock enable signals 70, four product-term set/resets 68, and four product-term OE signals 66. It will be appreciated that the actual number of each type of product-term control signal produced by AND array 60 is arbitrary and is driven by a tradeoff between fuse count and flexibility. In contrast to the "bit-oriented" approach of the prior art, however, the control signals do not have to be generated on an individual I/O cell basis, resulting in a significant saving of fuse count and permitting optimization of array inputs to the control array. For example, because each 4:1 MUX 12 in an I/O cell 31 requires two MUX select signals 54, a fully independent control of all 16 4:1 MUXes 12 within I/O block 32 of FIG. 3 requires 32 MUX select signals. However, such a degree of individual control would be wasted in a bus-switching application, wherein MUXes relating to signals on a given bus cannot be switched independently of one another. Thus, for the embodiment illustrated in FIG. 4, product-term MUX select signals 54 are arranged in sets 54a through 54d of two product-term signals each. Referring back to FIG. 3, Set 54a would control four of the 4:1 MUXes 12, set 54b would control another four, and so on. A similar tradeoff between individual control and fuse count produces just four signals each for the product-term set/resets 68, clock/clock enables 70, and OE signals 66. However, to increase flexibility for the set/resets 68 and OE signals 66, each are arranged in sets of two product-term signals, each set having an AND-OR capability by using OR gates 65. It will be appreciated that in other embodiments of the invention, OR capability could be provided for the clock/clock enable signals 70 as well. Alternatively, no OR capability could be provided should that type of control flexibility not be desired.

Traditionally, the formation of an AND array 60 has required the use of sense amplifiers to provide the logical AND operation of its many inputs. It is difficult to scale, however, a sense amplifier to modern semiconductor minimal sizes and power demands. Thus, in one embodiment, the AND array 60 may be formed as disclosed in U.S. application Ser. No. 09/704,487, entitled "Wide Input Programmable Logic System and Method," filed Nov. 2, 2000, the contents of which are hereby incorporated by reference. This application discloses an AND array using a CMOS array fused by a novel electrically erasable non-volatile memory cell that requires no sense amplifiers. For the control array embodiment illustrated in FIG. 4, 64*20=1,280 fuses would be required. Thus, for each I/O block 32, an additional 1,280 fuses are required to implement the control array 56.

Figure 5:
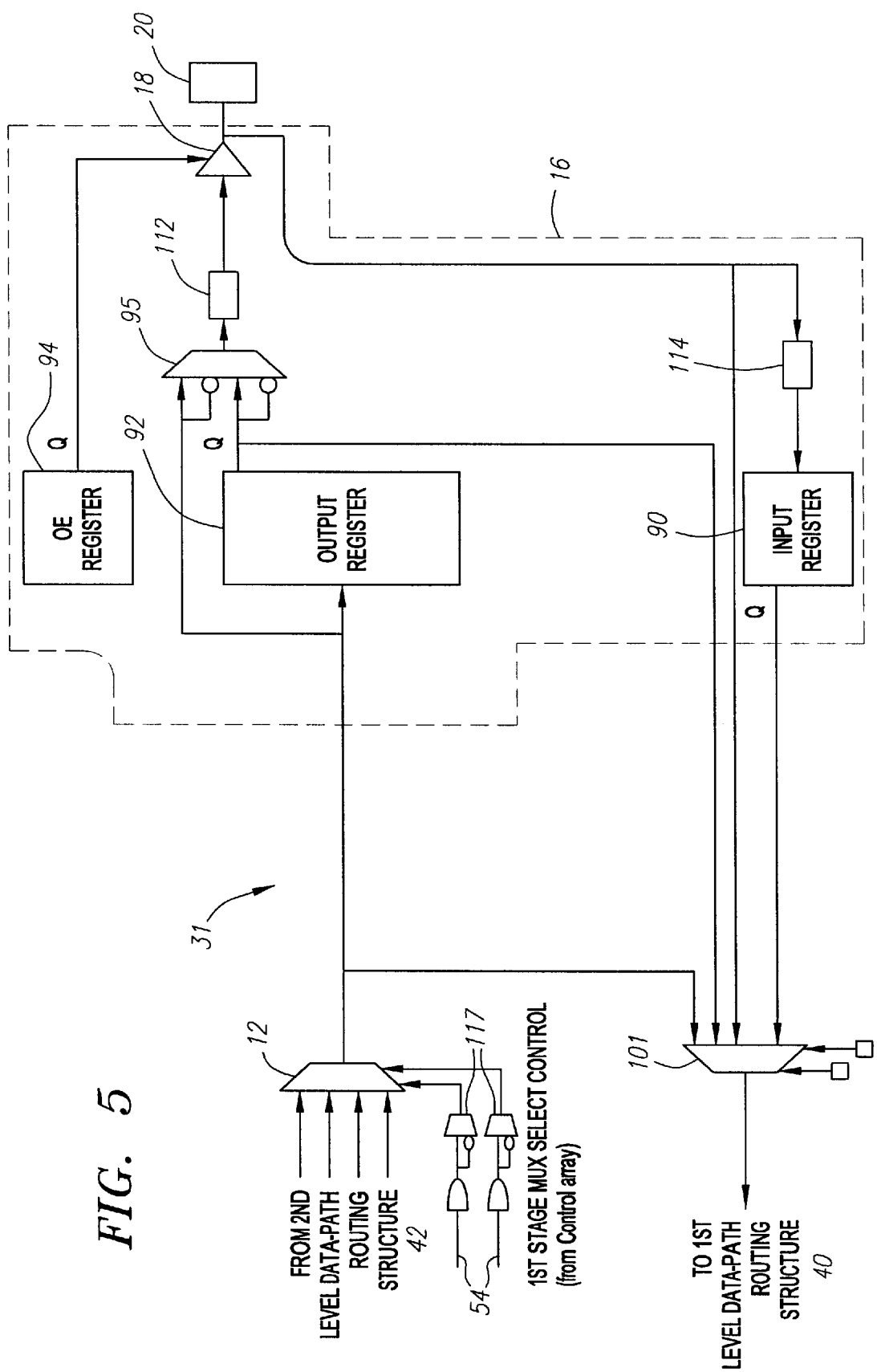
FIG. 5 is a block diagram for an I/O cell according to one embodiment of the invention.

Turning now to FIG. 5, an embodiment for the I/O circuit 16 of FIG. 3 has its input register 90 and output register 92 separated, providing true bi-directional input and output capabilities. The output register 92 receives the output of the 4:1 MUX 12 and provides a registered output signal Q to an output buffer 18, which provides an output signal to the pin 20. An OE register 94 controls the output buffer 18. The input register 90 receives its input from the pin 20. A feedback or input MUX 101 for the I/O circuit 16 selects from outputs from the 4:1 MUX 12, the output register 92, and the input register 90, providing a fast feedback path to the GRP 14.

Because each 4:1 MUX 12 may have this fast feedback path, wider MUXes such as 16:1, 64:1 or even wider may be formed through MUX cascading with additional incremental GRP delays. For example, a 16:1 MUX (not illustrated) can be configured from the outputs of 5 4:1 MUXes 12, resulting in one additional level of GRP delay. Similarly, a 64:1 MUX (not illustrated) can be configured out of 21 4:1 MUXes 12, resulting in two additional levels of GRP delay. The width of the MUX is only limited by the supply of 4:1 MUXes 12 and the levels of delay that can be tolerated.

Figure 6:
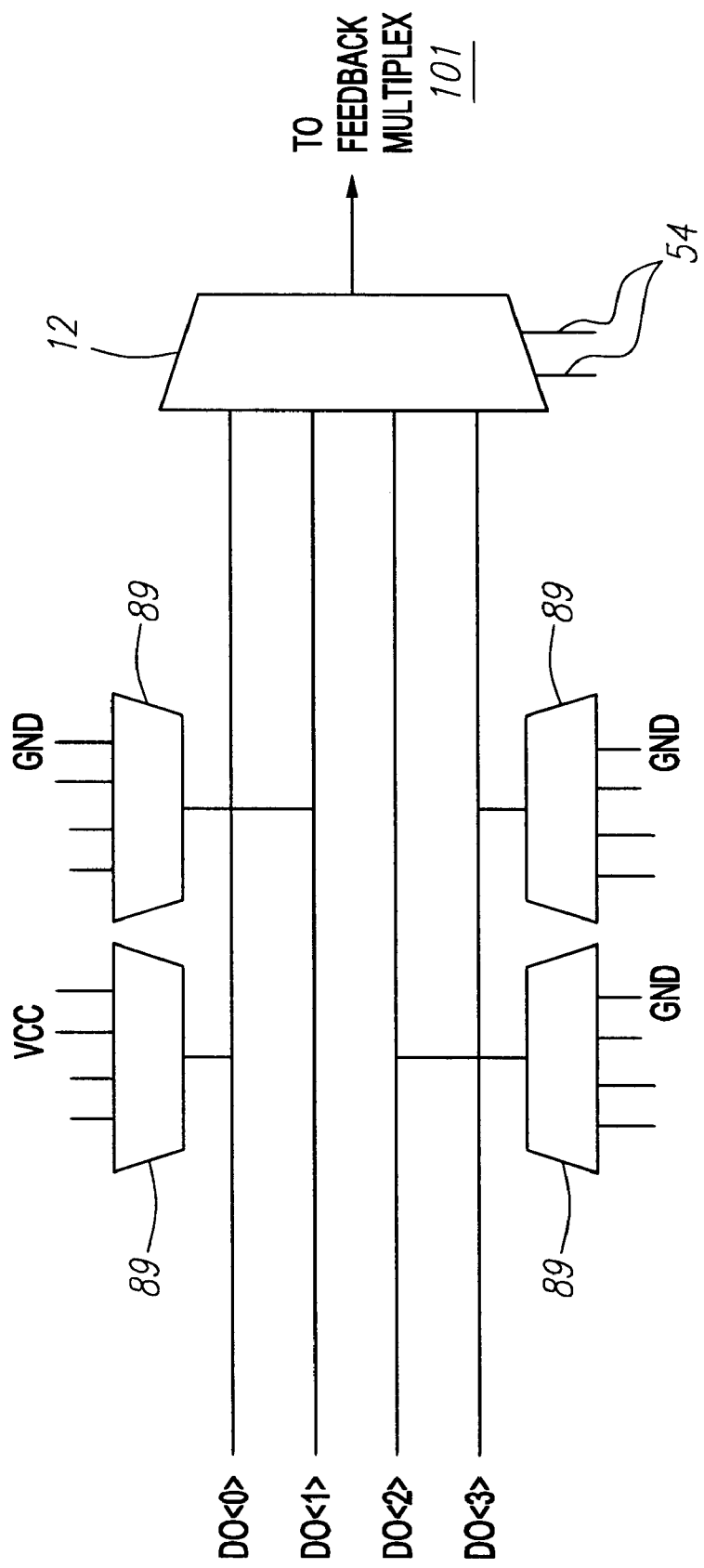
FIG. 6 illustrates a 4:1 multiplexer for the I/O cell of FIG. 5 adapted to implement a look-up table.

In addition to forming wider MUXes, the fast feedback path may be used to form larger look-up tables (LUTs). Each 4:1 MUX 12 may be configured as a 2-input LUT using its four-data inputs and two product-term MUX select signals 54. Using the fast feedback path, four 2-input LUTs may be combined to form a four-input LUT (not illustrated), resulting in one additional level of GRP delay. In such an embodiment, the state of the four data inputs would have to be known so that they may be "looked-up" according to the state of the two product-term MUX select signals 54. Referring now to FIG. 6, four multiplexers 89 couple to respective data inputs of 4:1 multiplexer 12 to provide these known inputs. Each multiplexer 89 may provide either VCC or ground on its data input to provide a known binary state. These known values form a truth table that is indexed according to product-term MUX select signals 54. The looked-up value is then provided to feedback multiplexer 101 as described with respect to FIG. 5.

Referring back to FIG. 5, an output register bypass MUX 95 selects between either the registered output Q of the output register 92 or the unregistered output of the 4:1 MUX 12. In this fashion, an output buffer 18 may receive either a registered or unregistered output signal. In addition, the output register bypass MUX 95 provides polarity control for either output signal. To prevent ground bounce, the output of the output register bypass MUX 95 couples to the output buffer 18 through a programmable delay element 112. Similarly, another programmable delay element 114 adjusts the hold time of the input register 90. Each register 90, 92, and 94 and the 4:1 MUX 12 within the I/O circuit 16 receives product-term control signals from the control array 56. The product-term MUX select signals 54 couple through polarity selection MUXes 117 to the 4:1 MUX 12. The coupling of the remaining product-term register control signals will now be described with respect to FIGS. 7a and 7b.

Figure 7A:
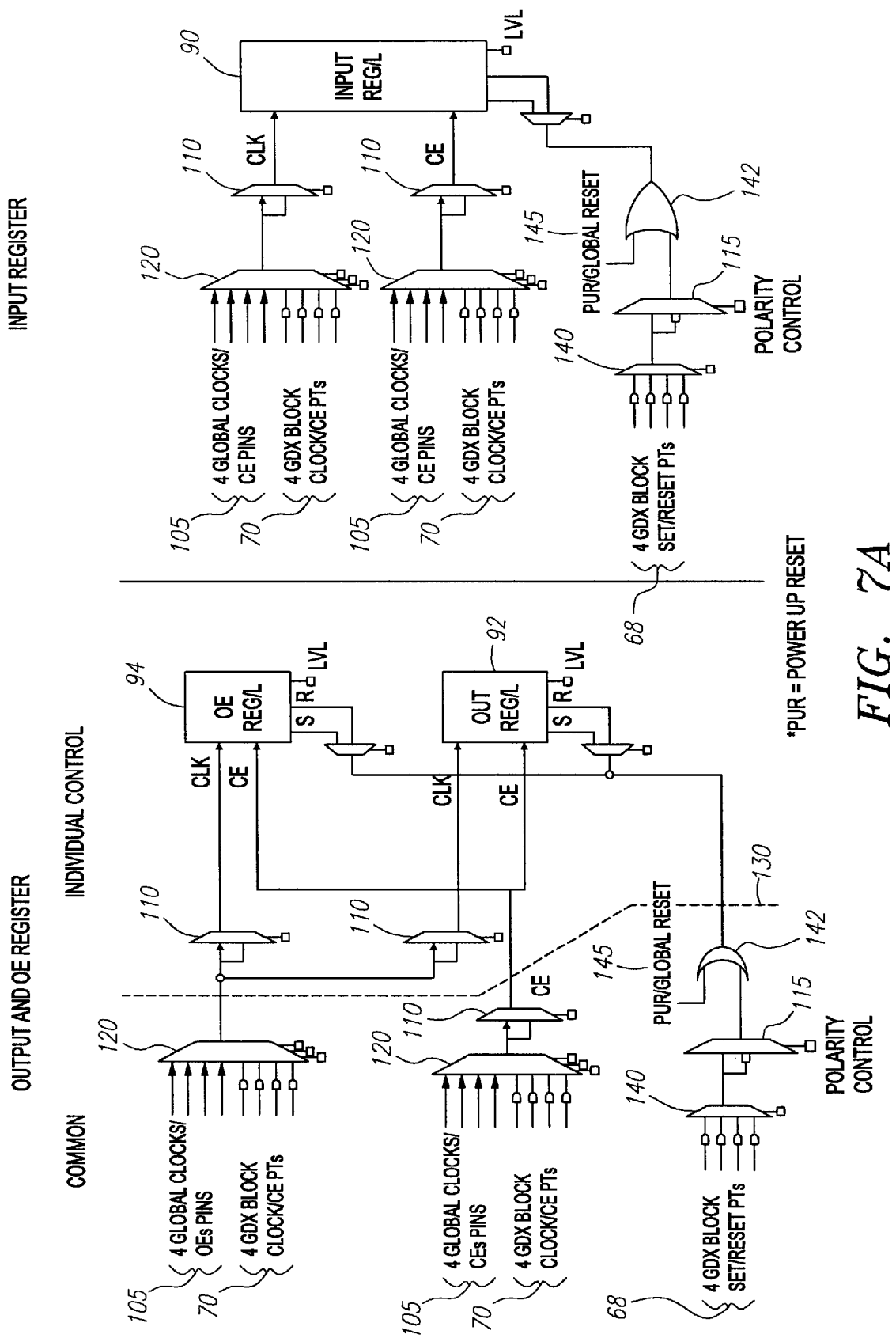
FIG. 7a illustrates the coupling of product-term control signals to the I/O cell of FIG. 5 according to one embodiment of the invention.

Turning now to FIG. 7a, the coupling of the product-term control signals from the control array 56 to the I/O cell's registers is illustrated. In addition to the product-term clock and clock enable (CE) signals 70, global clock signals 105 are also distributed to the registers. To control clock skew and permit clock synthesis, each global clock signal 105 is associated with a phase-locked loop (PLL) 100 (FIG. 2). Thus, should there be four global clock signals 105, there will be four PLLs 100. Further details regarding PLLs 100 are described in copending U.S. Application "Programmable Interconnect Circuit With a Phase-Locked Loop," U.S. Ser. No. 10/021,873, concurrently filed herewith, the contents of which are hereby incorporated by reference. Global clock signals 105 couple to programmable interconnect device 25 through dedicated pins (not illustrated). From these dedicated pins, global clock signals 105 are distributed to the I/O circuits 16 through a clock tree (not illustrated) independently of the routing structure 14. The clock and CE input to each register 90, 92, and 94 in I/O circuit 16 couples through a clock MUX 120 that selects between the global clock signals 105 and the product-term clock and clock enable (CE) signals 70. MUXes 110 provides polarity control for the output signal of clock MUXes 120. A clock MUX 120 may be common to both clock inputs of the OE register 94 and output register 92. Similarly, a clock MUX 120 may be common to both CE inputs of the OE register 94 and output register 92. However, as the dashed line 130 indicates, the polarity MUXes 110 provide individual control for these inputs despite their common origin at the clock MUXes 120.

The set and reset input signals for the registers 90, 92, and 94 are selected from the product-term set/reset signals 68 at MUXes 140. Polarity MUXes 115 provide polarity control to the MUX 140 output signal in a similar fashion as with the clock inputs. To permit a power-up reset (PUR) or global reset control function, a PUR/global reset signal 145 is ORed with the outputs of the polarity control MUXes 115 at OR gates 142.

Figure 7B:
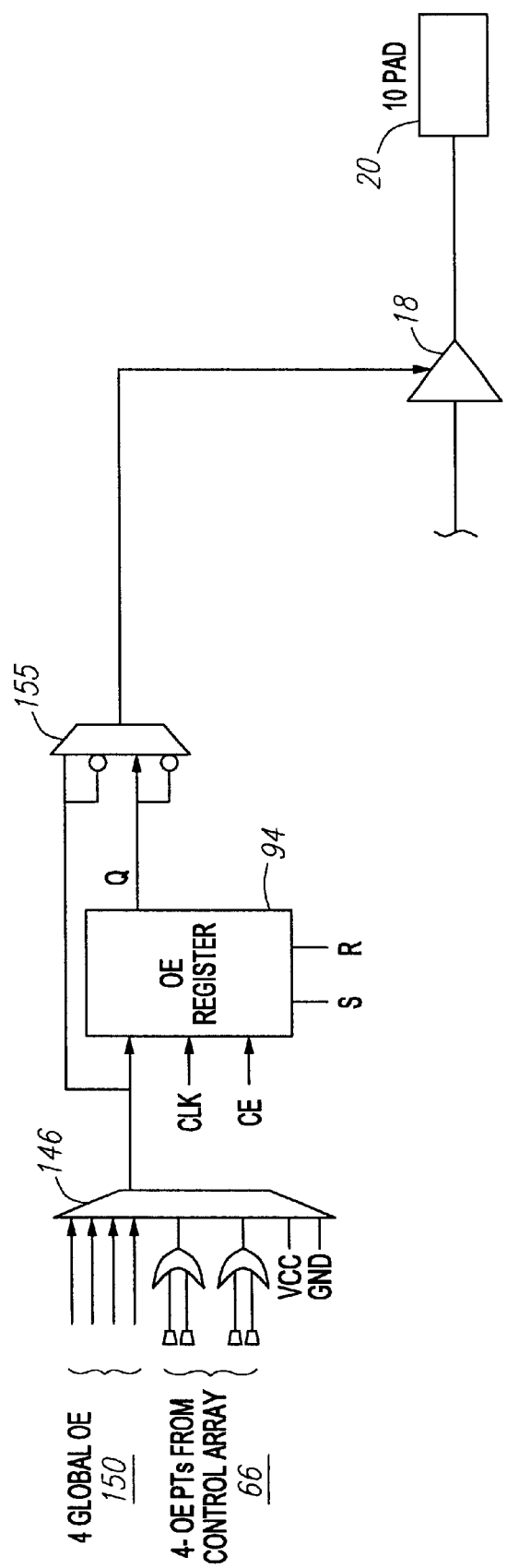
FIG. 7b illustrates further coupling of product-term control signals to the I/O cell of FIG. 5 according to one embodiment of the invention.
Figure 3:
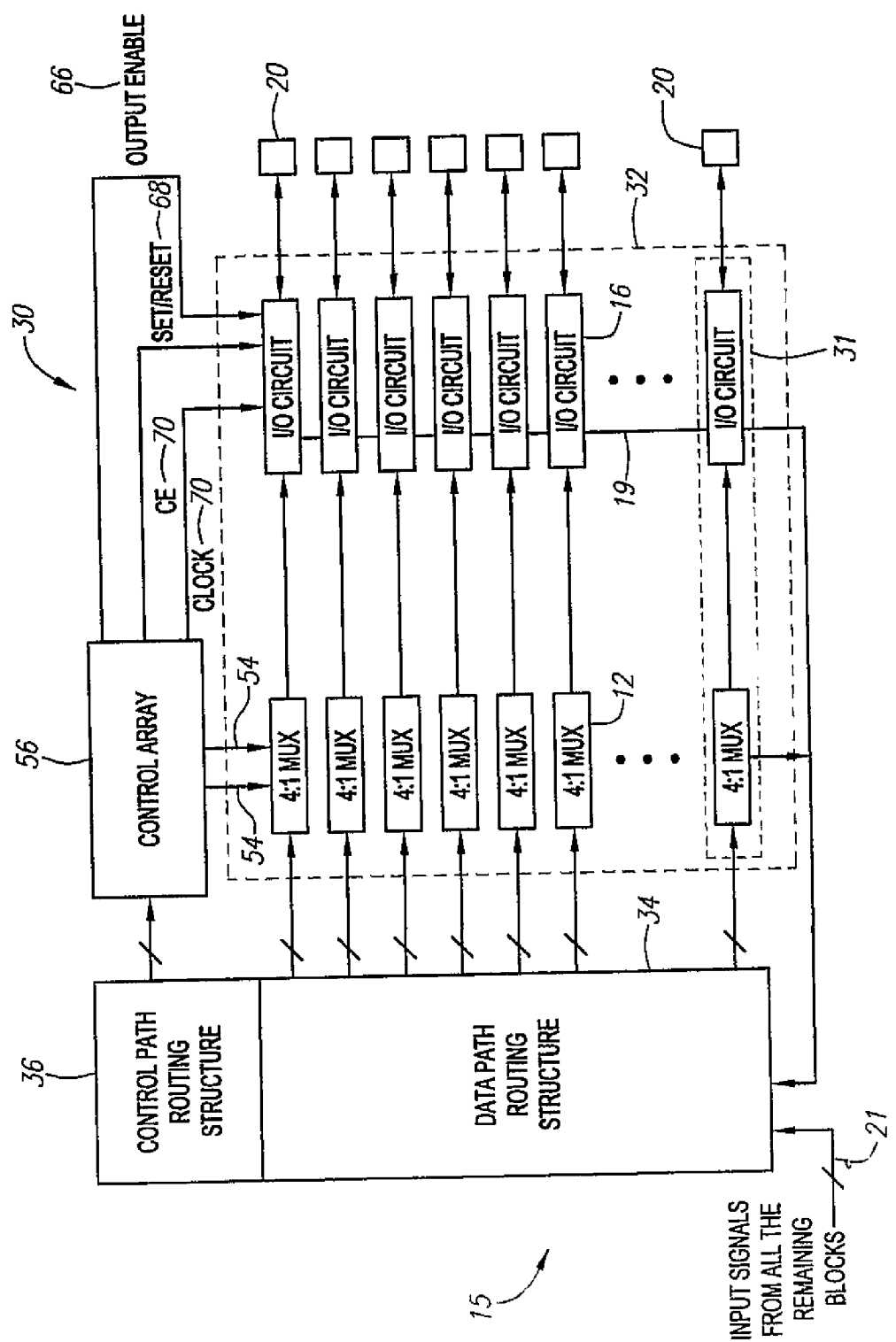

Turning now to FIG. 7b, the coupling of the product-term OE signals 66 from the control array 56 to the OE register 94 is illustrated. The data input to the output register 94 receives the output of a MUX 146 that selects between the product-term OE signals 66 and four global OE signals 150. These global OE signals 150 route from dedicated OE pins independently from routing structure 14 analogously to the global clock signals 105. In addition, MUX 146 may select either VCC or ground (GND) and provide the selected signal as the data input to OE register 94. Output enable register 94 controls output buffer 18. This control may be either registered or unregistered by the output enable register 94 because of an output enable register bypass MUX 155. If an unregistered control is desired, register bypass MUX 155 selects the output of MUX 146. Alternatively, the registered output Q of OE register 94 may be selected by register bypass MUX 155 for coupling to the output buffer 18.

The fusing of the routing structures 15 to form the programmable interconnect as well as the configuration of the remaining devices may occur through signals stored in non-volatile memory. This non-volatile memory may be in-system programmable. In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by its entirety to provide background information regarding in-system programmable circuits. In addition to in-system programmability, the programmable interconnect device disclosed herein may also have boundary scan test capability compliant with IEEE Std. 1149.1 (the "JTAG standard"). The JTAG standard, which is set forth in IEEE Standard Test Access Port and Boundary-Scan Architecture, published by the Institute of Electrical and Electronics Engineers, Inc. (May 1990) is well-known to those in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

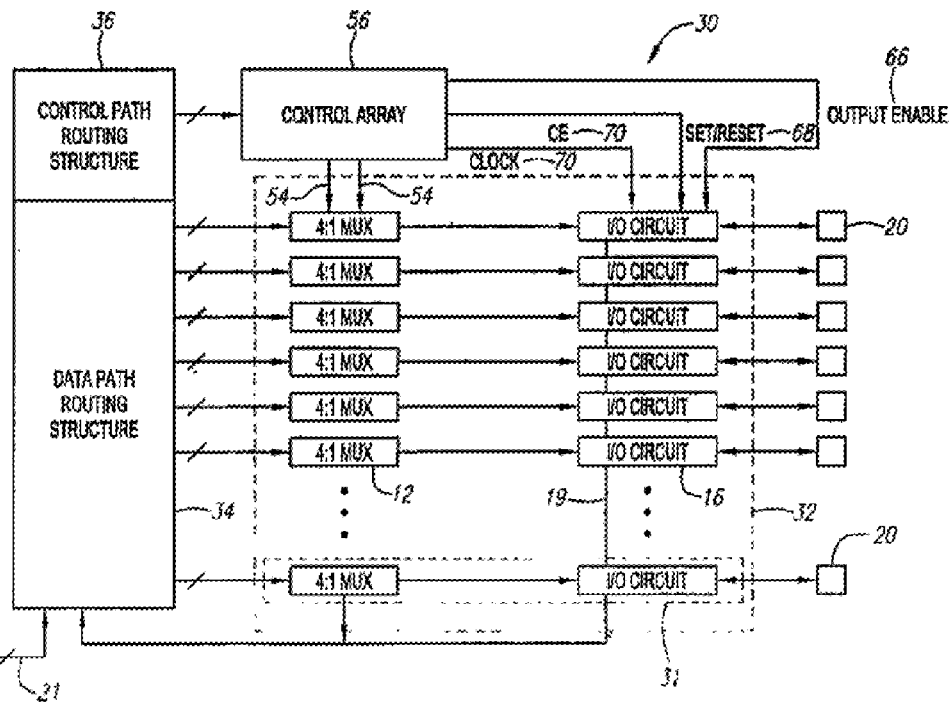

We claim:

1. A programmable interconnect circuit, comprising:
   a plurality of input/output (I/O) cells, wherein the I/O cells are arranged into a plurality of N I/O blocks and each I/O cell includes a multiplexer and a register associated with a pin of the programmable interconnect circuit;
   a plurality of N routing structures corresponding to the plurality of N I/O blocks, each routing structure configured to receive control and data signals from the plurality of I/O cells and programmably route the control and data signals into a set of control output signals and a set of data output signals; wherein each I/O block includes a programmable AND array, each programmable AND array being configured to receive the control output signals from its I/O block's routing structure and to provide M product term outputs to its I/O block's I/O cells, and wherein each I/O block's registers may receive data signals from the set of data signals routed by its routing structure.

2. The programmable interconnect circuit of claim 1, wherein the M product term outputs comprise set/reset signals and clock and clock enable signals for controlling the register within each I/O cell.

3. The programmable interconnect circuit of claim 2, wherein each multiplexer for each I/O cell within an I/O block is configured to receive a plurality of signals from its I/O block's routing structure's set of data output signals and select a multiplexer output signal, and wherein each register of each I/O cell within an I/O block comprises an output register coupled to receive the selected signal from its I/O cell's multiplexer and further includes an input register coupled to receive signals from its I/O cell's pin and provide the signals to its I/O cell's routing structure, the M product terms from each I/O block's routing structure further comprising MUX select signals for the I/O block's multiplexers.

4. The programmable interconnect circuit of claim 3, wherein each I/O cell further comprises:
   an output enable register, wherein each I/O block's M product term signals includes an output enable signal for controlling the I/O block's output enable registers.

5. The programmable interconnect circuit of claim 4, wherein the programmable AND array is further configured to provide the logical OR of signals from the set of M product terms signals used to form the set/reset and clock/clock enable signals.

6. The programmable interconnect circuit of claim 1, further comprising:
   a non-volatile memory for storing configuration data, wherein the configuration data is used to configure the programmable AND array.

7. The programmable interconnect circuit of claim 6, wherein the non-volatile memory is in-system programmable.

8. The programmable interconnect circuit of claim 1, wherein each routing structure in the plurality of routing structures comprises a data-path routing structure and a control-signal routing structure, each data-path routing structure producing its I/O block's set of data output signals, each control routing structure producing its I/O block's set of control output signals.

9. The programmable interconnect circuit of claim 8, wherein the register in each I/O cell comprises an input register, output register, and an output enable register, the set and reset signals for each input register, output register, and output enable register within an I/O block being derived from the I/O block's set of M product terms.

10. The programmable interconnect circuit of claim 9, wherein clock and clock enable signals for each input register, output register, and output enable register within an I/O block's I/O cells are derived from the I/O block's set of M product terms.

11. The programmable interconnect circuit of claim 10, wherein the same subset of product terms from the set of M product terms are used to derive the clock and clock enable signals for a given I/O cell's output register and output enable register.

12. The programmable interconnect circuit of claim 8, wherein each routing structure programmably routes its control and data signals according to the configuration data stored in the non-volatile memory.

13. The programmable interconnect circuit of claim 12, wherein the non-volatile memory is electrically erasable.

14. A programmable interconnect circuit, comprising;
   a plurality of input/output (I/O) blocks, each I/O block including a control array and at least two I/O cells, each I/O cell including a multiplexer coupled to an I/O circuit, the control array coupled to the select terminals of each multiplexer and to each I/O circuit; and
   a routing structure for receiving input signals and routing them to each I/O block, the routing structure programmable to provide control signals for the control array and data signals for the multiplexers.

15. The programmable interconnect circuit of claim 14, wherein each control array is programmable to route control signals received from the routing structure to each multiplexer and to each I/O circuit.

16. The programmable interconnect circuit of claim 15, wherein each control array includes an AND array.

17. The programmable interconnect circuit of claim 14, wherein each I/O circuit includes one or more registers and a set of control signal paths from the control array to the one or more registers.

18. The programmable interconnect circuit of claim 14, wherein the one or more registers include an input register, an output register, and an output enable register.

19. The programmable interconnect circuit of claim 14, wherein the control array is coupled to the select terminals of at least two multiplexers through a first common set of control signal paths and is coupled to at least two I/O circuits through a second common set of control signal paths.

20. The programmable interconnect circuit of claim 14, including a plurality of routing structures, wherein each muting structure corresponds to an I/O block.

21. A programmable interconnect circuit, comprising:
a plurality of input/output (I/O) blocks, each I/O block including a control array and at least sixteen I/O cells, each I/O cell including a multiplexer coupled to an I/O circuit, the control array coupled to the select terminals of a first set of at least four multiplexers through a first common set of control signal paths, to the select terminals of a second set of at least four multiplexers trough a second common set of control signal paths, to the select terminals of a third set of at least four multiplexers through a third common set of control signal paths, to the select terminals of a fourth set of at least four multiplexers through a fourth common set of control signal paths, and to each I/O circuit; and
a routing structure for receiving input signals and routing them to each I/O block, the routing structure programmable to provide control signals for the control array and data signals for the multiplexers.

22. The programmable interconnect circuit of claim 21, wherein the control array is coupled to a first set of at least four I/O circuits through a fifth common set of control signal paths, to a second set of at least four I/O circuits through a sixth common set of control signal paths, to a third set of at least four I/O circuits through a seventh common set of control signal paths, and to a fourth set of a least four I/O circuits through an eighth common set of control signal paths.

23. A programmable semiconductor device, comprising:
a plurality of input/output I/O cells each including an output multiplexer coupled to an I/O circuit, the I/O circuit including an input register, an output register, and an output enable register, the input register coupled to an I/O pin and operable to store an input signal received at the pin, the output register coupled to the multiplexer and operable to store an output signal received from the multiplexer for the I/O pin, and the output enable register coupled to an output buffer that is coupled between the output register and the I/O pin, the output enable register operable to control the output buffer to provide an output signal on the I/O pin;
a routing structure for receiving input signals from the I/O pins and routing them to the I/O cells, the routing structure programmable to provide control signals for the registers of the I/O circuit and data signals for the multiplexer within each I/O cell.

24. The programmable semiconductor device of claim 23, wherein the I/O circuit for each I/O cell includes a feedback multiplexer having its output terminal coupled to the routing structure and its input terminals coupled to the output terminal of the output multiplexer, the output register, the I/O pin, and the input register.

25. The programmable semiconductor device of claim 23, wherein the I/O circuit for each I/O cell includes a feedback multiplexer operable to feed the output signal of the output multiplexer back to the routing structure, and wherein the routing structure is programmable to route the fed back output signals from a first set of the output multiplexers to the input terminals of another one of the output multiplexers, thereby forming a wider multiplexer.

26. The programmable semiconductor device of claim 23, wherein the I/O circuit for each I/O cell includes an output register bypass multiplexer having an output coupled to the output buffer and an input selected from the output signal of the output multiplexer or the stored output signal of the output register.

27. The programmable semiconductor device of claim 26, wherein the output register bypass multiplexer is operable to select as an input signal from among the output signal of the output multiplexer, the inverse of the output signal, the stored output signal of the output register, and the inverse of the stored output signal.

28. The programmable semiconductor device of claim 23, wherein the I/O circuit for each I/O cell includes an output enable register bypass multiplexer coupled to the output buffer and operable to select between the output signal of the output multiplexer and the stored output signal of the output enable register.

29. The programmable semiconductor device of claim 28, wherein the output enable register bypass multiplexer is operable to select among the output signal of the output multiplexer, the inverse of the output signal, the stored output signal of the output enable register, and the inverse of the stored output enable signal.

30. The programmable semiconductor device of claim 23, wherein the I/O cells are arranged into I/O blocks of multiple I/O cells per block, and the routing structure is coupled to an I/O block through common control signal paths shared by the I/O cells within the I/O block.

31. The programmable semiconductor device of claim 30, wherein each I/O block includes a control array, the control array coupled to the output multiplexer and input register, output register, and output enable register of each I/O cell within its I/O block and programmable to provide control signals thereto derived from control signals received by the control array from the routing structure.

32. The programmable semiconductor device of claim 31, wherein the I/O cells within each I/O block are coupled to global signal paths to receive global signals specific to the I/O cells.

33. The programmable semiconductor device of claim 32, wherein the global signals comprise clock signals, clock enable signals, output enable signals, or output multiplexer select signals.

34. The programmable semiconductor device of claim 33, wherein the common control signals comprise clock product term signals, clock enable product term signals, output enable product term signals, or set/reset product term signals.

35. The programmable semiconductor device of claim 34, wherein each of the input register, output register, and output enable register within an I/O cell is coupled to receive global signals and common control signals.

36. The programmable semiconductor device of claim 35, wherein the output register and output enable register are coupled to receive the same global clock and clock enable signals and clock product term and clock enable product term signals.

37. The programmable semiconductor device of claim 34, wherein each I/O cell includes a demultiplexer coupled at its input terminal to a source of a register set/reset signal and coupled at its output terminals to set and reset terminals of at least one of the input register, output register, and output enable register within the I/O cell, the demultiplexer operable to switch a register set/reset signal received from the source between the set and reset terminals.

38. The programmable semiconductor device of claim 37, wherein the output register and output enable register are coupled to receive the same register set/reset signal.

39. The programmable interconnect circuit of claim 25 including:

a plurality of data signal paths coupled to input terminals of the output multiplexer; and a plurality of look-up table (LUT) multiplexers corresponding to the plurality of data signal paths, each LUT multiplexer having its output terminal coupled to its corresponding data signal path, one of its input terminals coupled to a source of high impedance, another of its input terminals coupled to a source of a logic 0 signal, and another of its input terminals coupled to a source of a logic 1 signal, the LUT multiplexers operable to provide, in combination with the output multiplexer, a look-up table for the I/O cell with the logic 0 or logic 1 source selected as the source of the output signal for each LUT multiplexer.

* * * * *

UNITED STATES PATENT AND TRADEMARK OFFICE
CERTIFICATE OF CORRECTION

PATENT NO. : 6,703,860 B1
DATED : March 9, 2004
INVENTOR(S) : Agrawal et al.

It is certified that error appears in the above-identified patent and that said Letters Patent is hereby corrected as shown below:

Column 9,
Line 3, "muting structure" should be -- routing structure --.
Line 12, "trough a second" should be -- through a second --.

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

| | |
|---|---|
| PATENT NO. | : 6,703,860 B1 |
| APPLICATION NO. | : 10/021844 |
| DATED | : March 9, 2004 |
| INVENTOR(S) | : Agrawal et al. |

It is certified that error appears in the above-identified patent and that said Letters Patent is hereby corrected as shown below:

The title page showing the illustrative figure should be deleted to be replaced with the attached title page.

The drawing sheet 3, consisting of Fig. 3, should be deleted to be replaced with drawing sheet, consisting of Fig. 3, as shown on the attached page.

Signed and Sealed this

Seventeenth Day of April, 2007

JON W. DUDAS
*Director of the United States Patent and Trademark Office*

United States Patent
Agrawal et al.

(10) Patent No.: US 6,703,860 B1
(45) Date of Patent: Mar. 9, 2004

(54) I/O BLOCK FOR A PROGRAMMABLE INTERCONNECT CIRCUIT

(75) Inventors: Om P. Agrawal, Los Altos, CA (US); Jinghui Zhu, San Jose, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

(21) Appl. No.: 10/021,844

(22) Filed: Dec. 14, 2001

(51) Int. Cl.[7] .................................. H03K 19/177
(52) U.S. Cl. ........................ 326/41; 326/38; 326/39; 326/40
(58) Field of Search ............................. 326/38–41

(56) References Cited

U.S. PATENT DOCUMENTS 5,621,650 A * 4/1997 Agrawal et al. ............. 716/16
5,966,027 A * 10/1999 Kapusta et al. ............. 326/39
6,034,541 A   3/2000 Kopec, Jr. et al.
6,211,696 B1 * 4/2001 Skahill et al. ............... 326/41
6,441,642 B1 * 8/2002 Jones et al. ................. 326/41

* cited by examiner

*Primary Examiner*—Vibol Tan
(74) *Attorney, Agent, or Firm*—McPherson Kwok Chen & Heid LLP

(57) ABSTRACT

A programmable interconnect circuit comprising a plurality of I/O cells arranged into I/O blocks includes a routing structure for each I/O block, wherein each routing structure may programmably route signals between the plurality of I/O cells and the I/O cells within its I/O block. Each I/O cell includes a multiplexer and an I/O circuit associated with a pin of the programmable interconnect circuit. Associated with each I/O block is a control array receiving control signals from its routing structure. An AND array in the control array produces a set of product term control signals for its I/O block from the received control signals.

39 Claims, 8 Drawing Sheets